(12) United States Patent
Tsunoda et al.

(10) Patent No.: US 6,654,305 B2
(45) Date of Patent: Nov. 25, 2003

(54) SYSTEM LSI HAVING A SUBSTRATE-BIAS GENERATION CIRCUIT WITH A SUBSTRATE-BIAS CONTROL-VALUE STORAGE UNIT

(75) Inventors: Takanobu Tsunoda, Kokubunji (JP); Osamu Nishii, Inagi (JP)

(73) Assignee: Hitachi, Ltd., Tokyo (JP)

( * ) Notice: Subject to any disclaimer, the term of this patent is extended or adjusted under 35 U.S.C. 154(b) by 54 days.

(21) Appl. No.: 10/259,777

(22) Filed: Sep. 30, 2002

(65) Prior Publication Data

US 2003/0063513 A1 Apr. 3, 2003

(30) Foreign Application Priority Data

Oct. 1, 2001 (JP) .................................. P2001-304897

(51) Int. Cl.[7] ................................................. G11C 7/00
(52) U.S. Cl. ........................................ 365/226; 365/229
(58) Field of Search ............................. 365/226, 227, 365/229; 327/534, 537

(56) References Cited

U.S. PATENT DOCUMENTS 5,604,707 A * 2/1997 Kuge et al. ............... 365/226
5,892,260 A   4/1999 Okumura et al. .......... 257/347
6,166,577 A  12/2000 Mizuno et al. ............. 327/278
6,341,087 B1 * 1/2002 Kunikiyo ................. 365/189.09
6,414,881 B1 * 7/2002 Fujii et al. ............... 365/189.09

FOREIGN PATENT DOCUMENTS

| EP | 0 991 191 A2 | 9/1999 |
| JP | 8-204140 | 1/1995 |
| JP | 8-274620 | 3/1995 |
| JP | 2000-112587 | 9/1999 |

* cited by examiner

Primary Examiner—Anh Phung

(57) ABSTRACT

A system LSI including substrate-bias generation circuits for supplying substrate biases independent of each other to functional modules integrated in the system LSI, a substrate-bias control circuit for controlling the substrate-bias generation circuits and a substrate-bias control-value storage unit for storing control values to be supplied to the substrate-bias generation circuits. The control values stored in the substrate-bias control-value storage unit are set by carrying out a predetermined operation. As a result, it is possible to provide a device for implementing both a high-speed operation and low power consumption without lowering the yield and for finely controlling the power consumption during the operation.

7 Claims, 9 Drawing Sheets

| CONTROL CODE | SET VALUES OF SUBSTRATE BIAS CONTROL SIGNAL | |
| --- | --- | --- |
| | CHIP 1 | CHIP 2 |
| 00 | C3 | C3 |
| 01 | C12 | C22 |
| 10 | C11 | C21 |
| 11 | C10 | C20 |

SYSTEM LSI HAVING A SUBSTRATE-BIAS GENERATION CIRCUIT WITH A SUBSTRATE-BIAS CONTROL-VALUE STORAGE UNIT

FIELD OF THE INVENTION

In general, the present invention relates to a data-processing device. More particularly, the present invention relates to a semiconductor data processor comprising semiconductor components manufactured by using a CMOS technology.

BACKGROUND OF THE INVENTION

In recent years, the market of portable information apparatus each integrating picture and sound processing functions as well as communication functions has been growing. In order to offer apparatus having small sizes at low prices, semiconductor data processors are required to display high performance, carry out a number of functions and have small power consumption.

By virtue of a developed technology to finely fabricate semiconductor devices, a large number of transistors capable of operating at a high speed can be integrated in a single chip, and a system LSI composing a system comprising functional modules on the single chip is becoming a realistic selectable option for increasing performance and raising the number of functions.

As for reduction of power consumption, the use of a low power supply for the entire system LSI is an effective means. If the power-supply voltage for sustaining a high-speed operation is lowered, a threshold voltage of the MOS FET is also lowered as well so that the transistor (the FET) is no longer turned off completely, raising a problem of an increase in so-called sub-threshold current. The increase in sub-threshold current causes an increase in power consumption without regard to whether the system LSI is in an operating state or in a standby state. In particular, in a battery-driven data-processing apparatus, reduction of power consumption due to consumption of the sub-threshold current for lengthening the driving time is a big problem.

A typical means for sustaining both a high-speed operation and a low power consumption at a low power-supply voltage is disclosed in Japanese Patent Laid-open No. Hei8-204140. This disclosed means is referred to as a first conventional technology. An outline of what is described in this document is described as follows. The document discloses a technique whereby, in an operating state of an LSI, a P-type region of each N-type MOS transistor is biased at an electric potential higher than the ground potential but lower than a forward-direction voltage of a PN junction. On the other hand, an N-type region of each P-type MOS transistor is biased at an electric potential lower than the power-supply voltage but higher than a voltage obtained as a result of subtracting the forward-direction voltage from the power-supply voltage. By biasing the transistors in this way, the threshold voltage can be lowered and yet a high-speed operation can be carried out. Furthermore, in a standby state, the P-type region of each N-type MOS transistor is biased at a ground potential while the N-type region of each P-type MOS transistor is biased at the power-supply voltage so that the threshold voltage is increased and the sub-threshold current is reduced.

In accordance with this technology, a bias-voltage generation circuit is provided for each functional module of the system LSI. In an operating state of the functional modules, the threshold voltage of the MOS transistors is lowered to a particular level in order to implement a high-speed operation. In a standby state, on the other hand, the threshold voltage is increased to another specific level to reduce the sub-threshold current. This technology provides arbitrariness to a substrate bias voltage for setting a threshold value in an operating state. In general, if the threshold voltage is lowered, the operating speed increases but the power consumption also rises as well. In order to reduce the power consumption, it is necessary to set the substrate bias voltage at a level that gives a highest threshold voltage required for achieving a desired operating speed and a desired operating speed margin. If this substrate bias voltage is set at a fixed level by for example the bias-voltage generation circuit, however, in the case of a low power-supply voltage, in dependence on the set value of the substrate bias voltage, variations in threshold voltage result in a decrease in maximum operating frequency and/or an increase in sub-threshold current causing an increase in power consumption, which in turn raises a problem of an extremely low yield of chips. The variations in threshold voltage are caused by big variations from process to process. For this reason, it is desirable to provide the system LSI with a means for setting an optimum substrate bias voltage for each chip and for each functional module.

A technique for controlling the substrate bias of a main circuit is disclosed in Japanese Patent Laid-open No. Hei8-274620. According to this technique, a substrate-bias-dependent-type oscillation circuit sharing a substrate bias with the main circuit and an oscillation circuit for generating a signal with a frequency varying in accordance with an operating state are employed. A substrate-bias control circuit compares oscillation outputs of the 2 oscillation circuits with each other in order to synchronize one of the oscillation outputs to the other oscillation output so that the substrate bias of the main circuit can be controlled optimally in accordance with the operating frequency. The disclosed technique is referred to hereafter as a second conventional technology.

In accordance with this technology, the output of the substrate-bias-dependent-type oscillation circuit provided for each functional module is synchronized with an input clock signal serving as an operating clock signal of the functional module so that it is possible to obtain an optimum bias determined univocally in accordance with the operating clock signal. In implementation of system LSIs having uniform functions but operating frequency margins different from each other, however, there is raised a problem that it is necessary to re-design the substrate-bias-dependent-type oscillation circuits in accordance with the required margins if this technology is to be adopted.

SUMMARY OF THE INVENTION

It is thus a first object of the present invention to provide a system LSI comprising MOS transistors or, to be more specific, a system LSI capable of maintaining a high-speed operation and a low power consumption without lowering a yield and capable of finely controlling the power consumption during the operation.

It is a second object of the present invention to provide a means for increasing the yield by compensation for variations in operating frequency from system LSI to system LSI, which are caused by variations from process to process, and variations in power consumption from system LSI to system LSI, which are also caused by variations from process to process.

It is a third object of the present invention to provide a means for implementing a system LSI having any operating frequency margin from a single-design system LSI.

In general, the system LSI comprises at least two functional modules having different specific data processing speeds and different rates of utilization. Examples of the functional module are a CPU, an FPU, a DSP, a cache memory, a bus state controller, a real-time clock, a timer, a communication interface, an AD converter, a DA converter, a digital circuit and an analog circuit even though the functional module is not specially limited to these examples. Each functional module may be further divided into a plurality of internal sub-modules. From the characteristic of this configuration, in order to reduce the power consumption of the system LSI, it is important to eliminate unnecessary consumption of power by fine execution of power management for each functional module.

In order to solve the problems described above, a system LSI provided by the present invention is characterized in that the system LSI comprises substrate-bias generation circuits for generating functional modules' substrate biases independent of each other, a substrate-bias control circuit for controlling the substrate-bias generation circuits and a substrate-bias-control-value storage unit for storing control values to be output to the substrate-bias control circuit.

In addition, each of the functional modules provided by the present invention is characterized in that the functional modules has at least 2 modes of operation, namely, an operating state and a standby state, the substrate bias of the functional mode in the operating state is adjusted to a level represented by a control value stored in a non-volatile memory or a register, while the substrate bias of the functional mode in a low-power-consumption state such as the standby state is adjusted to a predetermined level not represented by the control value stored in the non-volatile memory or the register.

Furthermore, each of the functional modules provided by the present invention is characterized in that the functional mode has a delay measurement circuit for measuring a delay of the functional module and carries out processing to determine a value stored in the non-volatile memory or the register by using the functional module's delay-test result produced by the delay measurement circuit.

Moreover, the system LSI provided by the present invention is characterized in that the system LSI has a communication interface for external interfacing, and a command is given to the system LSI through the communication interface by execution of a predetermined procedure, requesting the system LSI to carry out processing including but not specially limited to initialization of each functional module's substrate bias, mode of operation and clock-supplying control, inspection and initialization of the non-volatile memory or the register, measurement of a delay of each functional module, computation of a control value to be supplied to the substrate-bias generation circuit, an operation to store the control value into the substrate-bias-control-value storage unit and an operation to read out data and a delay measurement result from the substrate-bias-control-value storage unit and output the data and the delay measurement result to an external destination by way of the interface circuit.

In addition, the system LSI provided by the present invention is characterized in that the system LSI has at least a non-volatile memory or a register used as the substrate-bias-control-value storage unit, and a substrate bias of each functional module is controlled to a level represented by the control value stored in the non-volatile memory or the register before being supplied to the functional module.

Furthermore, the system LSI provided by the present invention is characterized in that the system LSI is capable of writing and reading out data into and from the non-volatile memory or the register and transferring a control value stored in the register to the non-volatile memory by execution of predetermined instructions, transferring a control value stored in the non-volatile memory to the register by execution of a predetermined procedure as well as implementing flexible management of power consumption by execution of software.

Moreover, the system LSI provided by the present invention is characterized in that the system LSI further has a clock oscillation circuit for generating the functional modules' clock signals independent of each other and the frequencies of the clock signals are controlled to values corresponding to substrate-bias values for the functional modules.

In accordance with the system LSI provided by the present invention, a substrate bias voltage optimum for each chip is supplied on the basis of a substrate-bias control value stored in advance in the register or the non-volatile memory used as the substrate-bias-control-value storage unit of the functional module put in an operating state so as to implement a high-speed operation while arbitrarily setting an operating frequency margin. For a functional module put in a low-power-consumption state such as the standby state, on the other hand, a substrate bias voltage raising the threshold voltage of MOS transistors is supplied on the basis of a predetermined control value different from the control value stored in the substrate-bias-control-value storage unit so as to reduce a subthreshold current and, hence, decrease the power consumption.

In addition, by controlling a functional-module control circuit through the communication interface, a delay measurement circuit provided in each functional module is capable of measuring delays of the functional modules for each system LSI. Then, by programming the non-volatile memory on the basis of results of the measurement, it is possible to execute substrate bias control compensating for variations in MOS-transistor characteristic, which are caused by variations in fabrication process and, hence, increase the yield of chips.

DETAILED DESCRIPTION OF THE PREFERRED EMBODIMENTS

Some preferred embodiments implementing the system LSI provided by the present invention are described by referring to diagrams.

First Embodiment

Figure 1:
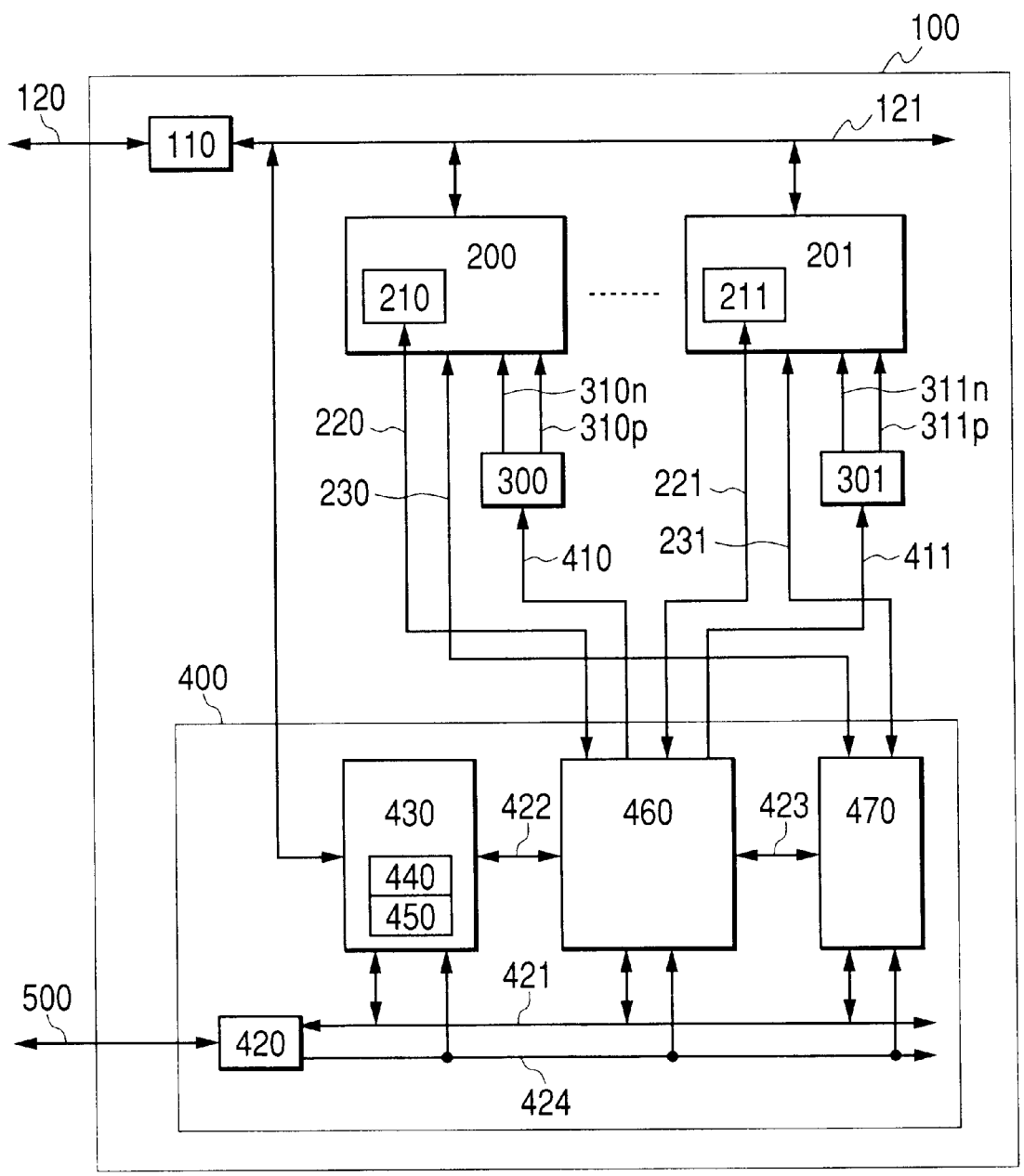
FIG. 1 is a block diagram showing a system LSI implemented by a first embodiment of the present invention.

FIG. 1 is a block diagram showing a system LSI implemented by a first embodiment of the present invention. In FIG. 1, reference numeral 100 denotes the system LSI provided by the present invention and reference numeral 110 denotes a bus interface unit serving as an interface between an external bus 120 and an internal bus 121.

Reference numerals 200 and 201 each denote a functional module. The system LSI 100 comprises at least two functional modules. Examples of the functional module are a CPU, an FPU, a DSP, a cache memory, a bus state controller, a real-time clock, a timer, a communication interface, an AD converter, a DA converter, a digital circuit and an analog circuit even though the functional module is not specially limited to these examples. The functional modules 200 and 201 are connected to each other by the internal bus 121 and connected to a device external to the system LSI 100 through the bus interface unit 110.

Reference numerals 210 and 211 denote delay measurement circuits for measuring delays of the functional modules 200 and 201 respectively. The delay measurement circuit 210 receives a delay measurement start signal from a delay measurement circuit control interface line 220, carries out a predetermined delay measurement and outputs a result of the delay measurement to the delay measurement circuit control interface line 220. By the same token, the delay measurement circuit 211 receives a delay measurement start signal from a delay measurement circuit control interface line 221, carries out a predetermined delay measurement and outputs a result of the delay measurement to the delay measurement circuit control interface line 221. The result of the delay measurement can be digital data with a size of at least 1 bit or an analog signal.

Reference numerals 230 and 231 denote operation-mode control interface lines for controlling the operation modes of the functional modules 200 and 201 respectively. The operation-mode control interface lines 230 and 231 each include an operation mode signal for indicating whether the operation mode of the functional module is the mode of an operating state or the mode of a low-power-consumption state such as a standby state. It is to be noted, however, that the operation modes of a functional module are not specially limited to the mode of an operating state or the mode of a low-power-consumption state.

Reference numerals 300 and 301 denote substrate-bias generation circuits for outputting substrate biases to the functional modules 200 and 201 respectively. In detail, the substrate-bias generation circuit 300 outputs substrate bias voltages 310n and 310p univocally determined by a substrate-bias control signal appearing on a substrate-bias control signal line 410 to N-type wells of P-type MOS transistors composing the functional modules 200 and P-type wells of N-type MOS transistors composing the functional module 200. By the same token, the substrate-bias generation circuit 301 outputs substrate bias voltages 311n and 311p univocally determined by a substrate-bias control signal appearing on a substrate-bias control signal line 411 to N-type wells of P-type MOS transistors composing the functional module 201 and P-type wells of N-type MOS transistors composing the functional module 201. The substrate-bias control signals appearing on the substrate-bias control signal line lines 410 and 411 can each be digital data with a size of at least 1 bit or an analog signal.

Reference numeral 400 denotes a functional-module control circuit. The functional-module control circuit 400 executes substrate-bias control of the functional modules 200 and 201 on the basis of a communication interface signal exchanged between the system LSI 100 and an external device through a communication interface line 500 or on the basis of request signals generated internally in the system LSI 100. The request signals are not shown in the figure. The substrate-bias control is executed to control operations composed of but not specially limited to delay measurements as well as collection of measurement results, processing to set operation modes of the functional modules 200 and 201 as well as gather information on the modes of operation and processing to output predetermined control values by using the substrate-bias control signals appearing on the substrate-bias control signal lines 410 and 411. The delay measurements and the collection of measurement results are driven by the delay measurement circuit control interface lines 220 and 221. The processing to set modes of operation and gather information on the modes of operation is driven by the operation-mode control interface lines 230 and 231.

Reference numeral 420 denotes a communication control circuit connected to the communication interface line 500. The communication control circuit 420 interprets a command coming through the communication interface line 500 by execution of a predetermined procedure. The communication control circuit 420 is also connected to typically a chip mode signal line 424 and a control interface line 421. The chip mode signal line 424 conveys a chip mode signal indicating that the system LSI 100 is in a specific chip mode such as a chip inspection mode. On the other hand, the control interface line 421 is used for exchanging a predetermined signal with a control circuit employed in the functional-module control circuit 400 on the basis of a result of interpretation of a command.

The command described above includes a command specifying an operation related to the substrate bias' calibration composed of but not limited to operations to read out and write data from and into a register 440 and a non-volatile memory 450, inspections of the register 440 and the non-volatile memory 450, measurements of delays of the functional modules 200 and 201 and operations to output results of the measurements.

Reference numeral 422 denotes a control interface line between a the bias-substrate-control-value storage unit 430 employed in the functional-module control circuit 400 and a substrate-bias control circuit 460 also employed in the functional-module control circuit 400. The control interface line 422 is used for transferring a predetermined control signal and data.

Reference numeral 423 denotes a control interface line between an operation-mode control circuit 470 employed in the functional-module control circuit 400 and the substrate-bias control circuit 460. The control interface line 423 is used for transferring a predetermined control signal and data.

As cited above, reference numeral 430 denotes a substrate bias control-value storage unit. In response to a predetermined control signal and data, which are received from the internal bus 121 and the control interface lines 421 and 422, the bias-substrate-control-value storage unit 430 executes access control and tests on the register 440 and the non-volatile memory 450.

It is to be noted that the non-volatile memory 450 is typically an EEPROM (Electrically Erasable and Programmable ROM) or an OTPROM (ROM writable only once), which is used in function implementations and/or applications of a data-processing device.

As cited above, reference numeral 460 denotes a substrate-bias control circuit. The substrate-bias control circuit 460 outputs substrate-bias control signals to the substrate-bias generation circuits 300 and 301 through the substrate-bias control signal lines 410 and 411 respectively on the basis of the contents of the register 440, which appear on the control interface line 422, and the values of operation-mode signals of the functional modules 200 and 201. The operation-mode signals appear on the control interface line 423.

In addition, while the substrate biases of the functional modules 200 and 201 are being changed by the substrate-bias control signals through execution of a predetermined procedure, the delay measurement circuits 210 and 211 employed in the functional modules 200 and 201 respectively measure delays of the functional modules 200 and 201 respectively, and output results of the measurements to the substrate-bias control circuit 460 to be compared with target delays set in advance. The substrate-bias control circuit 460 generates results of the comparisons and outputs the results of the comparisons typically in accordance with a control signal appearing on the control interface line 421 or uses the results for updating data stored in the non-volatile memory 450.

By the way, a delay is measured at least once with one of the following timings for each data-processing device:
1: After the data-processing device's package sealing or burn-in test
2: Power-in time of the data-processing device (automatically carried out)
3: Execution of a predetermined instruction
4: Execution of a predetermined procedure through the communication interface As cited above, reference numeral 470 denotes an operation-mode control circuit for gathering operation-mode information appearing on the operation mode control interface lines 230 and 231 for controlling operation modes of the functional modules 200 and 201 respectively, and for outputting the information on the operation mode to the substrate-bias control circuit 460 through the control interface line 423.

The operation-mode control circuit 470 also typically executes control to drive a specific functional module 200 or 201 through the operation-mode control interface line 230 or 231 respectively to transit to an operating state or a low-power-consumption state such as a standby state in accordance with a signal appearing on the control interface line 421 or a request made by an internal component employed in the system LSI 100. This internal component is not shown in the figure. It is to be noted that the operation-mode control circuit 470 may not execute this control.

As cited above, reference numeral 500 denotes a communication interface line serving as an interface between the functional-module control circuit 400 and a device external to the system LSI 100. Through the communication interface line 500, the operation of the functional-module control circuit 400 is controlled by execution of a predetermined procedure.

Figure 2:
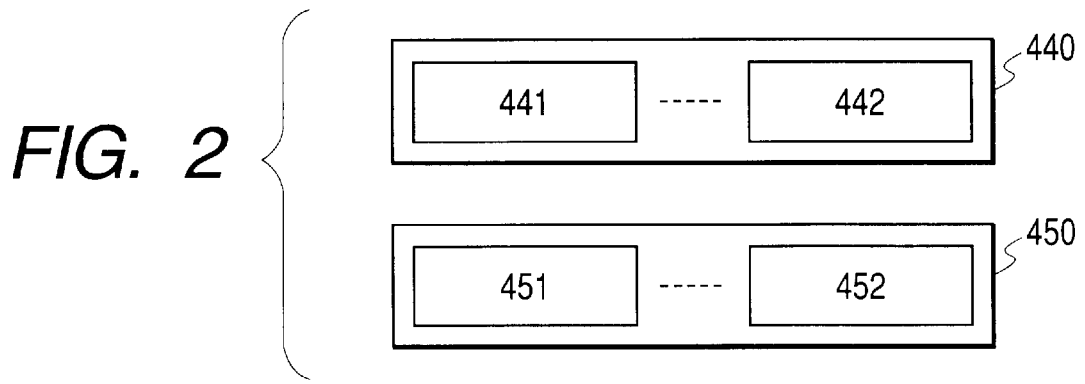
FIG. 2 is a diagram showing the configurations of a register and a non-volatile memory, which are employed in the first embodiment of the present invention.

FIG. 2 is a diagram showing the configuration of the register 440 and the non-volatile memory 450, which are employed in the first embodiment of the present invention. Reference numerals 441 and 442 denote substrate-bias-setting fields in the register 440, which are allocated to the functional modules 200 and 201 respectively. Used for storing digital values each representing a substrate bias voltage, the substrate-bias-setting fields 441 and 442 each have a width of at least 1 bit.

Data can be read out from and written into the register 440 by execution of typically load and store instructions or special instructions so that the substrate biases of the functional modules 200 and 201 can be controlled by using software.

In addition, when the power supply of the system LSI 100 is turned on, the register 440 is set at an initial value typically allowing each of the functional modules 200 and 201 to operate at a minimum power consumption and a maximum operating frequency prescribed by specifications with a predetermined operating-frequency margin.

By the same token, reference numerals 451 and 452 denote substrate-bias-setting fields in the non-volatile memory 450, which are allocated to the functional modules 200 and 201 respectively. Used for storing digital values each representing a substrate bias voltage, the substrate-bias-setting fields 451 and 452 each have a width of at least 1 bit. When the power supply of the system LSI 100 is turned on, the non-volatile memory 450 is set at an initial value typically allowing the functional modules 200 and 201 to operate at a minimum power consumption and a maximum operating frequency prescribed by specifications with a predetermined operating-frequency margin.

Typically, data can be read out from and written into the non-volatile memory 450 only in a special chip mode such as a chip inspection mode.

Figure 3:
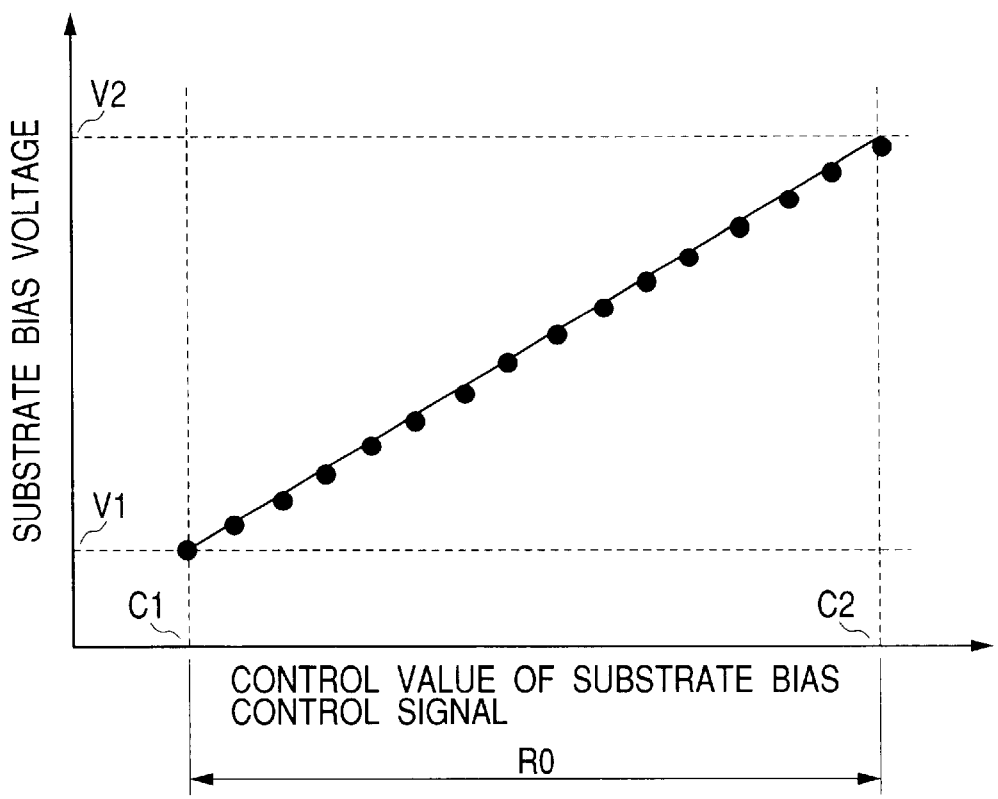
FIG. 3 is a diagram showing a relation between a substrate-bias control value and a substrate bias voltage in the present invention.

FIG. 3 is a diagram showing a relation between the control value of the substrate-bias control signal stored in a substrate-bias-setting field and the substrate bias voltage in the first embodiment of the present invention. Reference notation R0 denotes a range of the control value of the substrate-bias control signal stored in a substrate-bias-setting field. Reference notations C1 and C2 denote respectively the lower and upper limits of the range R0. Reference notations V1 and V2 denote substrate bias voltages corresponding to the control values C1 and C2 respectively. It is desirable even though not necessary to have substrate bias voltages V1 and V2 for an N-type well different from those for a P-type well.

It is not necessary to store uniform control values in substrate-bias-setting fields 441, 442, 451 and 452 for specific substrate bias voltages. It is possible to set any control values as long as the control values represent substrate bias voltages on a 1-on-1 relation basis. For example, the bit count of the substrate-bias-setting fields 441 and 442 may be different from that of the substrate-bias-setting fields 451 and 452.

Next, the operation of the system LSI 100 implemented by this embodiment is explained.

The system LSI 100 has the following modes of operation.

Chip Inspection Mode

The system LSI 100 is capable of entering this chip inspection mode only at a product inspection time when the system LSI 100 receives a predetermined input from an external source. The input received from the communication interface line 500 requests the system LSI 100 that delays of the functional modules 200 and 201 be measured. The system LSI 100 also determines whether proper control values can be programmed in the substrate-bias-setting fields 451 and 452 of the non-volatile memory 450 so as to provide the functional modules 200 and 201 with substrate biases that satisfy an operating frequency margin and a maximum operating frequency required by specifications and minimize the power consumption. If such proper control values can be programmed, the control values are programmed and a predetermined inspection is carried out on the operation of the system LSI 100.

Chip Calibration Mode

The system LSI 100 automatically enters this chip calibration mode when the system LSI 100 receives a predetermined input from an external source, when a predetermined instruction is executed or when the power supply is turned on. In this mode, proper control values are programmed in the substrate-bias-setting fields 451 and 452 of the non-volatile memory 450 not through the communication interface line 500 so as to provide the functional modules 200 and 201 with substrate biases that satisfy an operating frequency margin and a maximum operating frequency required by specifications and minimize the power consumption. In addition, a predetermined calibration is carried out on the system LSI 100. Furthermore, functions executable in the chip calibration mode can be limited to functions executable in the chip inspection mode even though this limitation is not specially required.

Normal Operating Mode

In this normal operating mode, the functional modules 200 and 201 are each capable of operating at a maximum frequency defined by specifications. In addition, a control value stored in a substrate-bias-setting field allocated in the register 440 for controlling substrate biases to a certain functional module is for example equal to a control value stored in a substrate-bias-setting field allocated in the non-volatile memory 450 to the certain functional module or is a value that can be converted into a control value stored in a substrate-bias-setting field allocated in the non-volatile memory 450 to the certain functional module.

Low-Power-Consumption Mode

In this low-power-consumption mode, the functional modules 200 and 201 are each capable of operating at a frequency lower than the maximum frequency defined by specifications or reducing the power consumption to a value lower than that of the normal operating mode because the operation is halted. In addition, a control value stored in a substrate-bias-setting field allocated in the register 440 for controlling substrate biases to a certain functional module is for example different from a control value stored in a substrate-bias-setting field allocated in the non-volatile memory 450 to the certain functional module by a difference in a direction of raising the threshold voltage of the functional module, or is a value that can be converted into a control value different from a control value stored in a substrate-bias-setting field allocated in the non-volatile memory 450 to the certain functional module by a difference in a direction of raising the threshold voltage of the functional module. Furthermore, if the operation-mode control interface line 230 indicates that the functional module 200 is in a standby state, the control value stored in a substrate-bias-setting field allocated in the register 440 to the functional module 200 is a value that can be converted into a control value for maximizing the threshold voltage of the functional module 200 without regard to the control value stored in the corresponding substrate-bias-setting field in the non-volatile memory 450. By the same token, if the operation-mode control interface line 231 indicates that the functional module 201 is in a standby state, the control value stored in a substrate-bias-setting field allocated in the register 440 to the functional module 201 is a value that can be converted into a control value for maximizing the threshold voltage of the functional module 201 without regard to the control value stored in the corresponding substrate-bias-setting field in the non-volatile memory 450.

It is to be noted that a chip mode signal 424 indicates whether the operation mode of the functional module 200 or 201 is a chip inspection mode, a chip calibration mode or a mode other than the chip inspection mode and the chip calibration mode. In the case of a mode other than the chip inspection mode and the chip calibration mode, the operation mode control interface lines 230 and 231 indicate whether the operation modes of the functional modules 200 and 201 are the normal operating mode or the low-power-consumption mode excluding the standby state.

As described earlier, the functional modules 200 and 201 integrated in the system LSI 100 are connected to each other by the internal bus 121 and connected to the external bus 120 through the bus interface unit 110. In this configuration, the functional modules 200 and 201 carry out processes such as data processing and transfers of data by execution of predetermined procedures each comprising mainly a series of instructions input from the internal bus 121.

Examples of the functional modules 200 and 201 are a CPU, an FPU, a DSP, a cache memory, a bus state controller, a real-time clock, a timer, a communication interface, an AD converter, a DA converter, a digital circuit and an analog circuit. In general, however, the required maximum performance varies from module to module. In addition, the operating frequency needed in processing changes with time in accordance with the substance of the requested processing and the requested processing time.

In the present invention, the substrate bias of each functional module is controlled finely by using software in order to control power consumption and dynamic processing performance in the course of instruction execution. In addition, a fabrication-yield decrease caused by variations from process to process, which result from miniaturization of the fabrication process, is compensated for by changing set values of the substrate biases for each chip and changing a set value of the substrate bias for each functional module. As a result, the fabrication yield is increased.

Next, the operation of the system LSI 100 in each of the operation modes is explained.

First of all, the operations of the system LSI 100 in the normal operating mode and the low-power-consumption mode are explained.

In these modes of operation, the substrate biases of the functional modules 200 and 201 are determined by the substrate-bias-setting fields allocated in the register 440 to the functional modules 200 and 201.

In a power-on or reset operation of the system LSI 100, for example, the register 440 is initialized typically at a value equal to that of the non-volatile memory 450 or a value that can be converted into that of the non-volatile memory 450 by execution of a predetermined procedure for the power-on or reset operation.

Figures 4, 5:
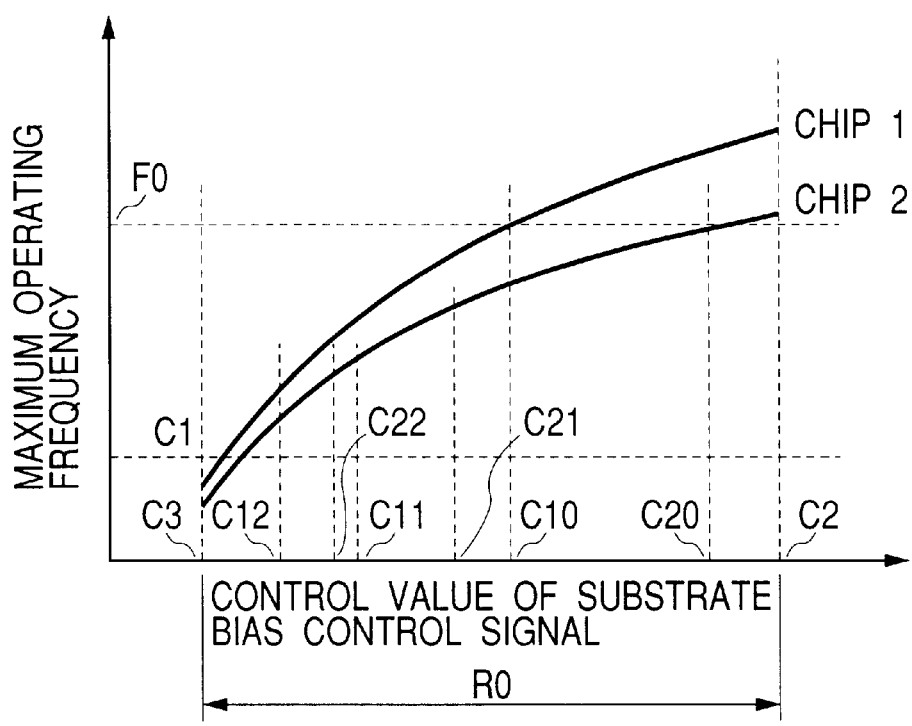
FIG. 4 is a diagram showing relations between the substrate-bias control value for a specific functional module and a maximum operating frequency of the functional module.
FIG. 5 is a diagram showing a relation between a substrate bias control code and the substrate-bias control value.

FIG. 4 is a diagram showing relations between the control value of the substrate-bias control signal supplied to a substrate-bias generation circuit for a specific functional module and the maximum operating frequency of the functional module. Chips 1 and 2 are each a system LSI. Chips 1 and 2 have frequency characteristics different from each other due to variations from process to process. Reference notation R0 denotes a range of the control value of the substrate-bias control signal. Reference notation F0 denotes the functional module's maximum frequency defined by specifications. Reference notations C1 and C2 denote respectively the lower and upper limits of the control-value range R0. Reference notation C10 denotes the substrate-bias control signal's control value required for operating chip 1 at the maximum operating frequency defined by the specifications. By the same token, reference notation C20 denotes the substrate-bias control signal's control value required for operating chip 2 at the maximum operating frequency defined by the specifications.

That is, the control value C10 of the substrate-bias control signal is stored in a substrate-bias setting field allocated in the non-volatile memory 450 to a functional module in chip 1. By the same token, the control value C20 of the substrate-bias control signal is stored in a substrate-bias setting field allocated in the non-volatile memory 450 to a functional module in chip 2. Reference notation C3 denotes the substrate-bias control signal's control value, when the functional module is set in a standby state by the operation-mode control interface line. In the range R0, the control value C3 coincides with the control value C1, which provides the functional module with a largest threshold value and a lowest maximum operating frequency.

Thus, in a substrate-bias setting field allocated in the register 440 to a functional module in chip 1, the substrate-bias control signal's control value in the sub-range C3 to C10 of the settable control-value range RO can be stored. By the same token, in a substrate-bias setting field allocated in the register 440 to a functional module in chip 2, the substrate-bias control signal's control value in the sub-range C3 to C20 of the settable control-value range RO can be stored. Therefore, when a request is made to set a control value outside the range by using a predetermined means such as execution of an instruction to store data into the register 440, a request made by execution of an operation of the bias-substrate-control-value storage unit 430 to set a control value in the register 440 is ignored.

It is to be noted that, in order to simplify the substrate bias control using software, representative values of the settable sub-range C3 to C10 for chip 1 are computed by carrying out predetermined processing from the control value C10 and each represented by a control code to be stored in the register 440 as a control value of the substrate-bias control signal. In the case of chip 1, the representative values of the settable sub-range C3 to C10 are C3, C10, C11 and C12 as shown in FIG. 5. By the same token, representative values of the settable sub-range C3 to C20 for chip 2 are computed by carrying out predetermined processing from the control value C20 and each represented by a control code to be stored in the register 440 as a control value of the substrate-bias control signal. In the case of chip 2, the representative values of the settable sub-range C3 to C20 are C3, C20, C21 and C22 as shown in FIG. 5.

In this case, a control code read out from the register 440 is converted into a control value of the substrate-bias control signal by a predetermined procedure for the register 440, and supplied to the substrate-bias control circuit 460 through the control interface line 422.

On the other hand, information on operation modes of the functional modules 200 and 201 is gathered in the operation-mode control circuit 470 through the operation-mode control interface lines 230 and 231 and then further supplied to the substrate-bias control circuit 460 through the control interface line 423. The substrate-bias control circuit 460 outputs substrate-bias control signals to the substrate-bias generation circuits 300 and 301 through the substrate-bias control signal lines 410 and 411 respectively. As described above, the substrate-bias generation circuits 300 and 301 are used for generating substrate biases for the functional modules 200 and 201 respectively. The substrate-bias control signals are generated from a control value of the substrate-bias control signal received through the control interface line 422 and operation-mode information received through the control interface line 423 typically as follows.

If the information on modes of operation for the functional modules 200 and 201 indicates that a standby state is not requested for the functional modules 200 and 201, the control value of the substrate-bias control signal received through the control interface line 422 is output to the substrate-bias generation circuits 300 and 301 for generating substrate biases for the functional modules 200 and 201 respectively as a substrate-bias control signal.

If the information on modes of operation for the functional modules 200 and 201 indicates that a standby state is requested for the functional modules 200 and 201, on the other hand, another control value different from the control value of the substrate-bias control signal received through the control interface line 422 is output to the substrate-bias generation circuits 300 and 301 for generating substrate biases for the functional modules 200 and 201 respectively as a substrate-bias control signal. The other control value is a settable control value that maximizes the threshold values of the functional modules 200 and 201.

Figure 6:
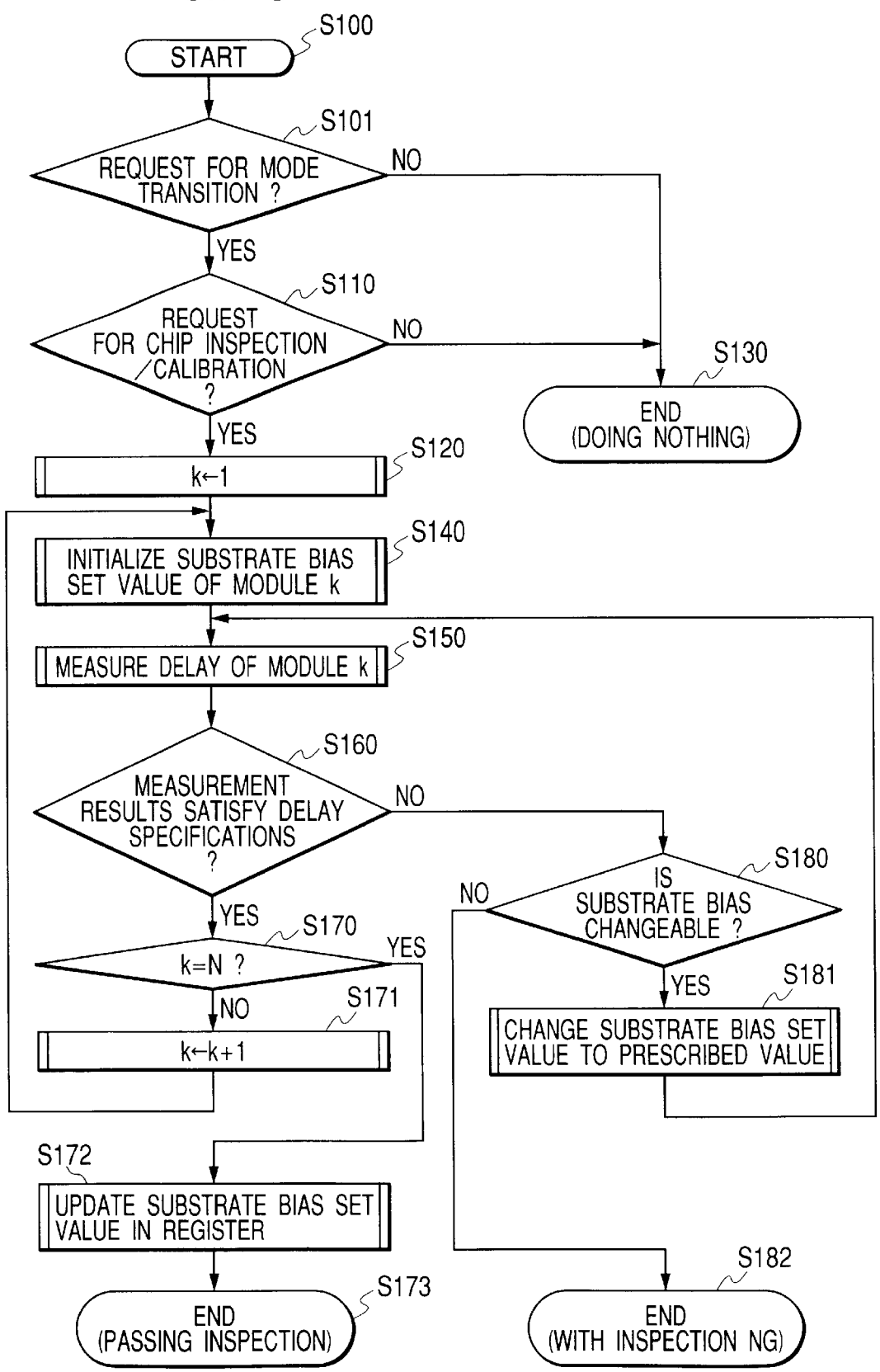
FIG. 6 shows a flowchart representing chip inspection/calibration according to the present invention.

By referring to a flowchart shown in FIG. 6, the following description explains chip inspection and the chip calibration, which are carried out by the system LSI 100 in the chip inspection mode and the chip calibration mode respectively.

In these modes, a sequential procedure represented by the flowchart shown in FIG. 6 is executed through the communication interface line 500 from time to time or automatically. As an alternative, the substrate-bias-control circuit 460 automatically executes the procedure. The procedure is executed to determine or update control values stored in the non-volatile memory 450 and required in the substrate bias control of the functional modules 200 and 201.

In the flowchart shown in FIG. 6, notation N denotes the number of functional modules to be subjected to the substrate bias control among the functional modules 200 and 201. N is thus integer not exceeding the number of functional modules actually integrated in the system LSI 100.

The flow of the procedure goes on from the first step S100 to a step S101 to determine whether there is a request for a transition to a predetermined mode such as a chip inspection mode or a chip calibration mode. A predetermined input to the system LSI 100 from an external pin or a power-on operation is interpreted as a request for a transition to a predetermined mode, namely, a chip inspection mode or a chip calibration mode. If there is such a request, the flow of the procedure goes on to a step S110 to confirm that the request is a request for a transition to a chip inspection mode or a chip calibration mode by verifying that a predetermined value is appearing on the chip mode signal line 424. If a request for a transition to a chip inspection mode or a chip calibration mode is confirmed, the flow of the procedure goes on to a step S120 at which a chip inspection or a chip calibration is started by:

1: having the communication control circuit 420 decode a predetermined command appearing on the communication interface line 500, or 2: executing an instruction requesting a calibration.

It is to be noted that if there is no request for a transition to a predetermined mode or if there is a request for a transition to a predetermined mode but the request is not a request for a transition to a chip inspection mode or a chip calibration mode, on the other hand, the flow of the procedure goes on to a step S130.

The chip inspection/calibration is carried out automatically for each functional module k, where k is the functional module's number represented by an integer in the range 1 to N, in accordance with the command appearing on the communication interface line 500 or by execution of the instruction requesting a calibration.

The chip inspection/calibration begins with a step S140 at which the substrate-bias control circuit 460 sets a control value for controlling the substrate-bias generation circuit of functional module k typically at a value increasing the threshold value of functional module k. As described earlier, the value increasing the threshold value of functional module k is the control value C3 shown in FIG. 4. Then, at the next step S150, the delay measurement circuit is activated through the delay measurement circuit control interface line and results of the delay measurement are collected from the delay measurement circuit control interface line as digital data having a size of at least 1 bit or as an analog signal.

Subsequently, the flow of the procedure goes on to a step S160 to determine whether the results of the delay measurement satisfy a target delay and a target delay margin. If the results of the delay measurement satisfy the target delay and the target delay margin, the flow of the procedure goes on to a step S170 to determine whether all functional modules have been subjected to the chip inspection/calibration. If not all functional modules have been subjected to the chip inspection/calibration, the flow of the procedure goes on to a step S171 to select functional module (k+1) as the next functional module to be subjected to the chip inspection/calibration. In this case, the current control value is used as a control value for controlling the substrate-bias generation circuit of this next functional module.

If the results of the delay measurement do not satisfy the target delay and the target delay margin, on the other hand, the flow of the procedure goes on to a step S180 to determine whether the control value for controlling the substrate-bias generation circuit can be changed. If the control value can be changed, the flow of the procedure goes on to a step S181 at which the control value is changed to a value in a range that the threshold value of functional module k becomes lower but the chip is by no means thermally destroyed. Then, the delay measurement is again carried out.

If a control value for controlling the substrate-bias generation circuit of each of the N functional modules has been determined successfully, on the other hand, the flow of the procedure goes on to a step S172 at which data stored in the non-volatile memory 450 is updated. Then, at the next step S173, a notice is output typically by way of the control interface line 421, the communication control circuit 420 and the communication interface line 500 to inform that the operations of circuits involved in the substrate bias control are carried out normally by execution of a predetermined procedure.

If the results of the delay measurement satisfy neither the target delay nor the target delay margin and the control value for controlling the substrate-bias generation circuit cannot be changed to a value in a range that the chip is by no means thermally destroyed, on the other hand, the flow of the procedure goes on to a step S182 at which the chip inspection/calibration is terminated. Then, a notice is output typically by way of the control interface line 421, the communication control circuit 420 and the communication interface line 500 to inform that the operations of circuits involved in the substrate bias control are not carried out normally by execution of a predetermined procedure.

It is to be noted that the results of the delay measurement can also be stored in a predetermined internal register employed in the system LSI 100. In this case, no notice is output by way of the control interface line 421, the communication control circuit 420 and the communication interface line 500. The internal register is not shown in FIG. 1.

In addition, in order to prevent the system LSI 100 from being thermally destroyed in the operation flow of the chip inspection/calibration or in the normal operation, a temperature measurement means or a current-consumption measurement means can be provided inside or outside the system LSI 100. It is to be noted that these means are also not shown in FIG. 1.

By execution of the chip inspection/calibration represented by the flowchart described above, a substrate bias of each functional module in any of the system LSI can be set at such a control value that the system LSI 100 operates at a possible minimum power consumption and satisfies the target delay as well as the target delay margin, that is, a maximum operating frequency and an operating frequency margin, which are defined by specifications, without thermally destroying the chip.

Furthermore, by applying the procedure represented by this flowchart to each system LSI at a chip inspection time particularly after a chip packaging process or after a burn-in test, it is possible to compensate for variations from process to process and, hence, increase the fabrication yield.

Second Embodiment

Figure 7:
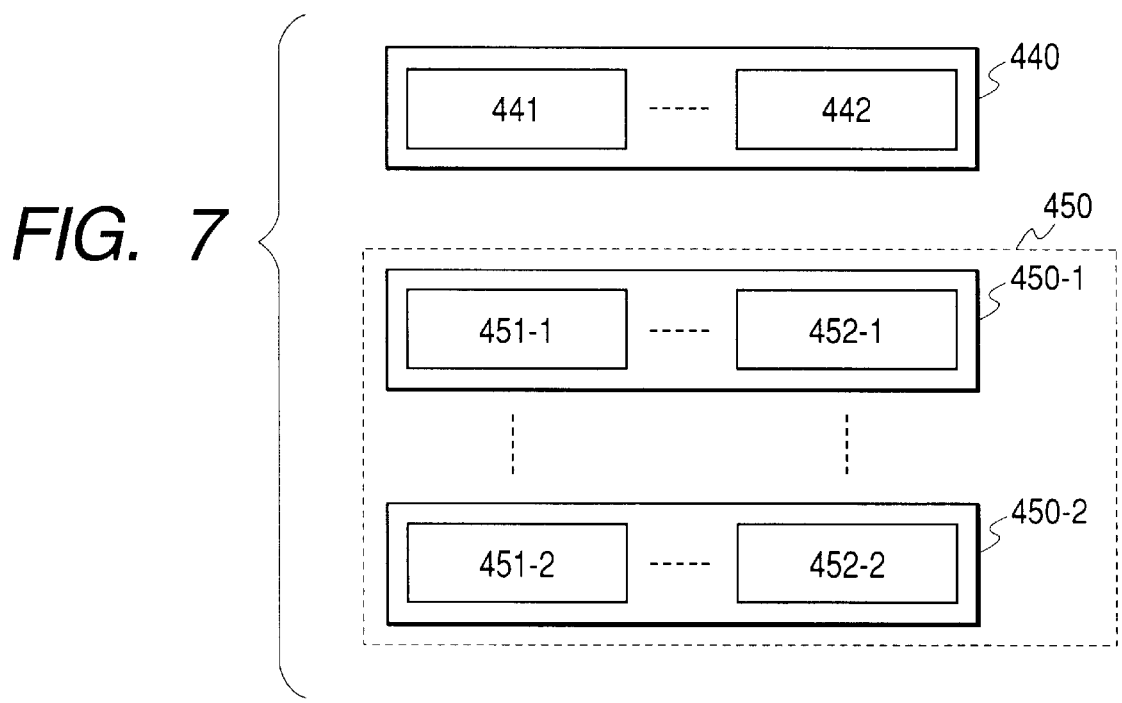
FIG. 7 is a diagram showing the configurations of a register and a non-volatile memory, which are employed in a second embodiment of the present invention.

FIG. 7 is a diagram showing the configurations of the register 440 and the non-volatile memory 450, which are employed in a second embodiment of the present invention. It is to be noted that a block diagram showing the system LSI implemented by the second embodiment is the same as that of FIG. 1.

Reference numerals 441 and 442 shown in FIG. 7 denote substrate-bias-code-setting fields in the register 440, which are allocated to the functional modules 200 and 201 respectively. Used for storing codes each representing a substrate bias voltage, the substrate-bias-code-setting fields 441 and 442 each have a width of at least 1 bit.

Data can be read out from and written into the register 440 by execution of typically load and store instructions or special instructions. In addition, when the power supply of the system LSI 100 is turned on, the register 440 is set at an initial value typically allowing each of the functional modules 200 and 201 to operate at a maximum operating frequency allowed by specifications like the characteristic of the first embodiment.

A plurality of reference numerals 450-1 and 450-2 each denote the same non-volatile memory as the non-volatile memory 450 of the first embodiment. There are employed as many non-volatile memories as substrate-bias control codes described above. Reference numerals 451-1 and 451-2 denote substrate-bias-setting fields in the non-volatile memories 450-1 and 450-2 respectively. The substrate-bias-setting fields 451-1 and 451-2 are allocated to the functional module 200. By the same token, reference numerals 452-1 and 452-2 denote substrate-bias-setting fields in the non-volatile memories 450-1 and 450-2 respectively. However, the substrate-bias-setting fields 452-1 and 452-2 are allocated to the functional module 201.

The number of non-volatile memories denoted by reference numerals 450-1 and 450-2 in the figure is typically four even though the number of such non-volatile memories does not have to be four in particular. Each of the four non-volatile memories includes substrate-bias-setting fields for storing set values for all functional modules. The first non-volatile memory is used for storing set values allowing the functional modules to operate at a maximum operating frequency. The second non-volatile memory is used for storing set values allowing the functional modules to operate at half the maximum operating frequency. The third non-volatile memory is used for storing set values allowing the functional modules to operate at ⅛ of the maximum operating frequency. The fourth non-volatile memory is used for storing set values allowing the functional modules to operate at ¹⁄₃₂ of the maximum operating frequency. Thus, in order to initialize the 4 non-volatile memories, it is necessary to execute the chip inspection/calibration represented by the flowchart for the first embodiment 4 times.

Like the characteristic of the first embodiment, data can be read out from and written into the non-volatile memories 450-1 and 450-2 only in a special chip mode such as a chip inspection mode even though this characteristic is not required in particular.

A relation between data stored in the register 440 and data stored in the non-volatile memories 450-1 and 450-2 is described as follows. In the case of the functional module 200, for a first value stored in the substrate-bias-code-setting field 441, the substrate-bias-setting field 451-1 allocated in the first non-volatile memory 450-1 to the functional module 200 is selected. For a second value stored in the substrate-bias-code-setting field 441, on the other hand, the substrate-bias-setting field 451-2 allocated in the second non-volatile memory 450-2 to the functional module 200 is selected. This relation also applies to the functional module 201 as well.

In the case of the first embodiment, the storage size of the non-volatile memory 450 is minimized and the number of times the chip inspection/calibration procedure is executed is also minimized. On the other hand, the second embodiment is characterized in that a maximum operating frequency at which a functional module can operate is associated with each substrate bias code so that, even though a bigger storage size of the non-volatile memory or a larger number of non-volatile memories is required, the software-based controllability for executing the substrate bias control on the basis of the utilization rates of the functional modules is improved.

Third Embodiment

Figure 8:
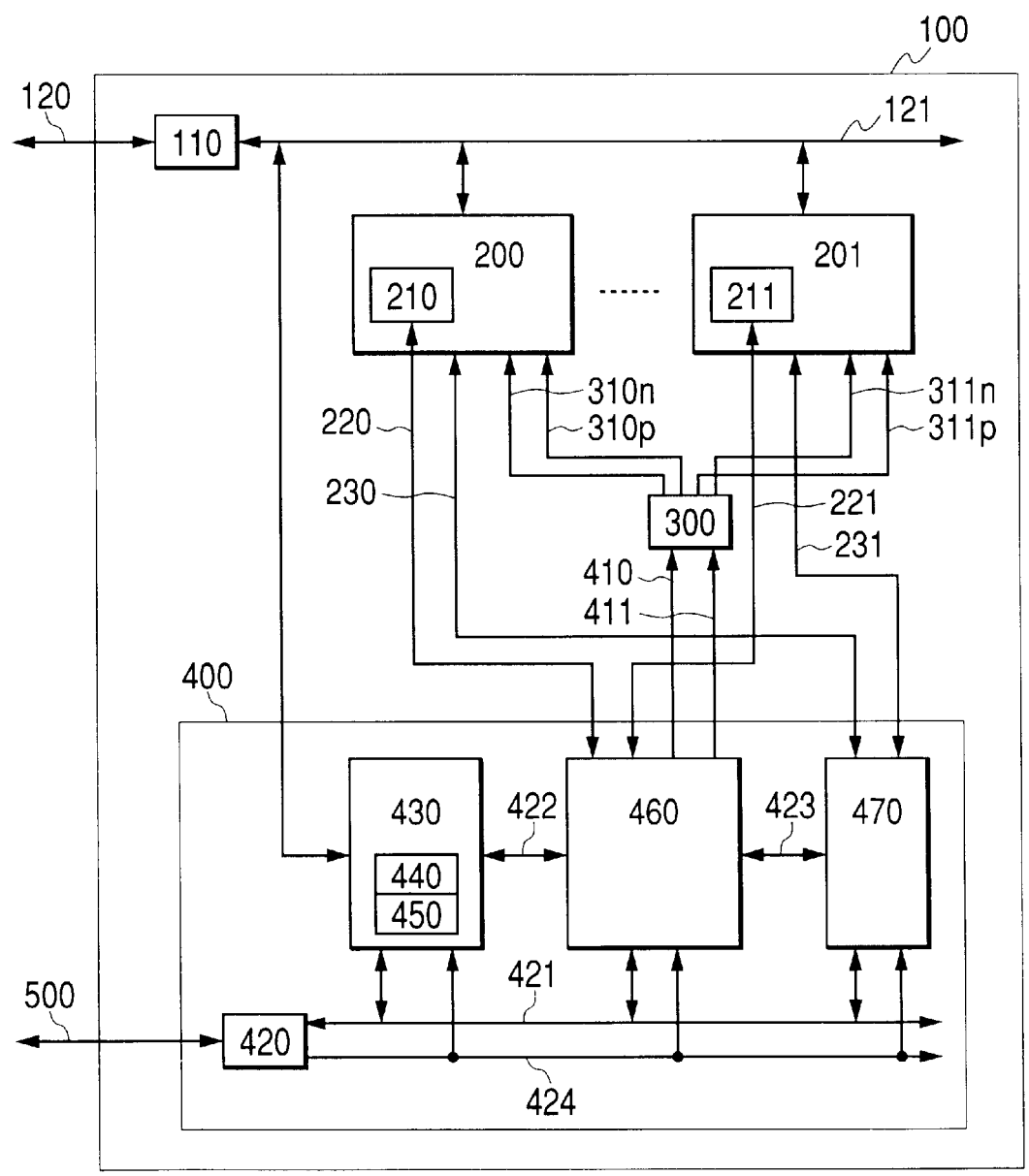
FIG. 8 is a diagram showing the configuration of a system LSI implemented by a third embodiment of the present invention.

FIG. 8 is a block diagram showing the configuration of a system LSI implemented by a third embodiment of the present invention. The configurations of the register 440 and the non-volatile memory 450 are identical with the first embodiment's counterparts shown in FIG. 1 or the second embodiment's counterparts shown in FIG. 7.

The third embodiment is different from the first or second embodiment in that, in the case of the third embodiment, a substrate-bias generation circuit common to all functional modules is employed and capable of generating at least an output corresponding to the substrate bias of each functional module. For example, the common substrate-bias generation circuit may have a multi-voltage output circuit configuration employing a potentiometer comprising resistors connected to each other in series. Thus, a low-cost substrate-bias generation circuit can be implemented.

Fourth Embodiment

Figure 9:
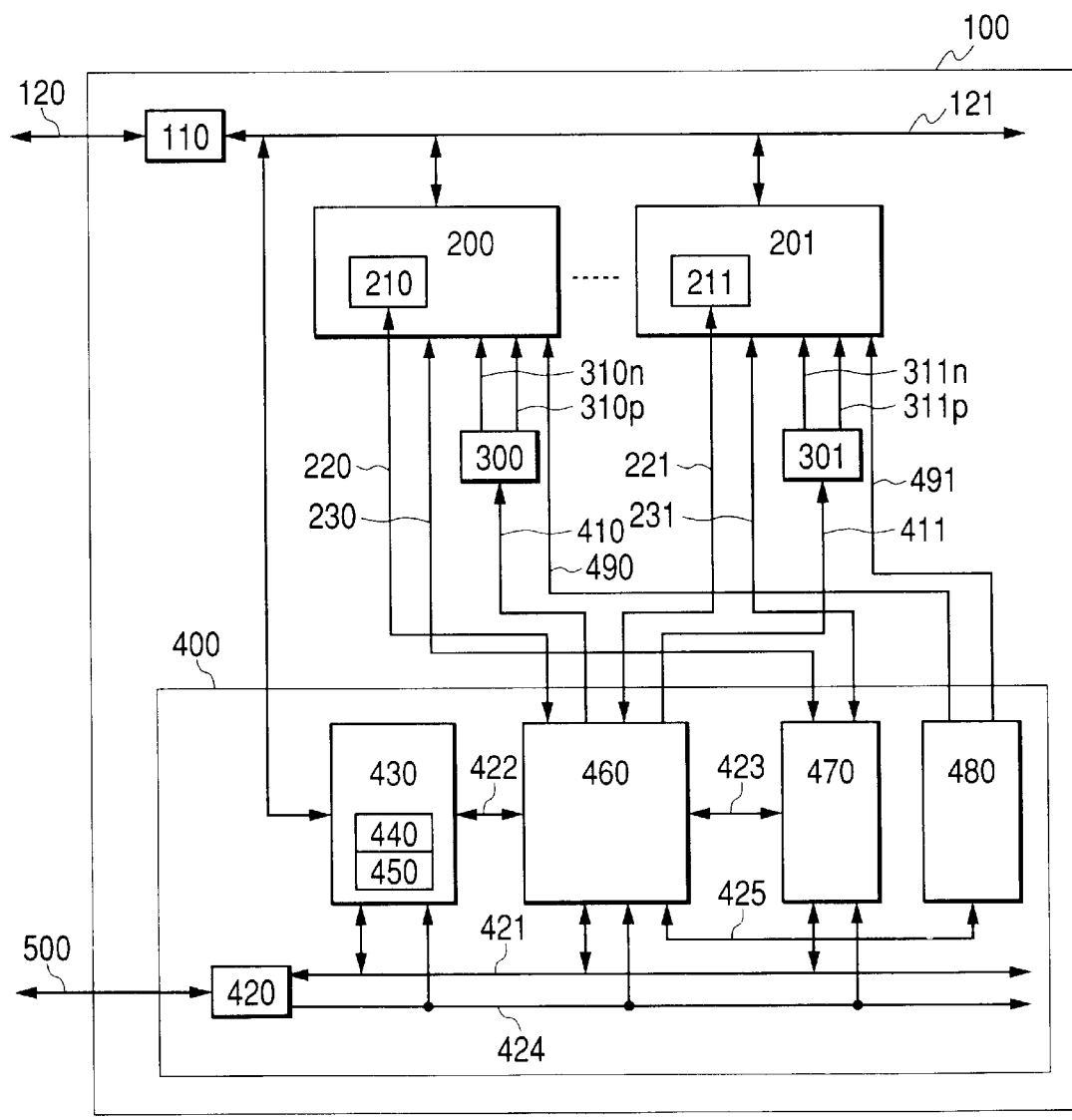
FIG. 9 is a diagram showing the configuration of a system LSI implemented by a fourth embodiment of the present invention.

FIG. 9 is a block diagram showing the configuration of a system LSI implemented by a fourth embodiment of the present invention. The configurations of the register 440 and the non-volatile memory 450 are identical with the first embodiment's counterparts shown in FIG. 1 or the second embodiment's counterparts shown in FIG. 7.

The fourth embodiment is different from the first, second and third embodiments in that, in the case of the fourth embodiment, a clock generation circuit 480 for outputting clock signals 490 and 491 to the functional modules 200 and 201 respectively and a control interface line 425 between the substrate-bias control circuit 460 and the clock generation circuit 480 are added in the functional-module control circuit 400.

The clock generation circuit 480 collaborates with the substrate-bias control circuit 460 through the control interface line 425. In detail, the frequencies of the clock signals 490 and 491 are controlled to predetermined values not exceeding the maximum operating frequencies for substrate biases controlled by the substrate-bias control circuit 460 based on the setting in the register 440.

In accordance with the fourth embodiment, the power consumption of each functional module in a low-power consumption state such as the standby state is even lower than that of the first, second and third embodiments.

Fifth Embodiment

Figure 10:
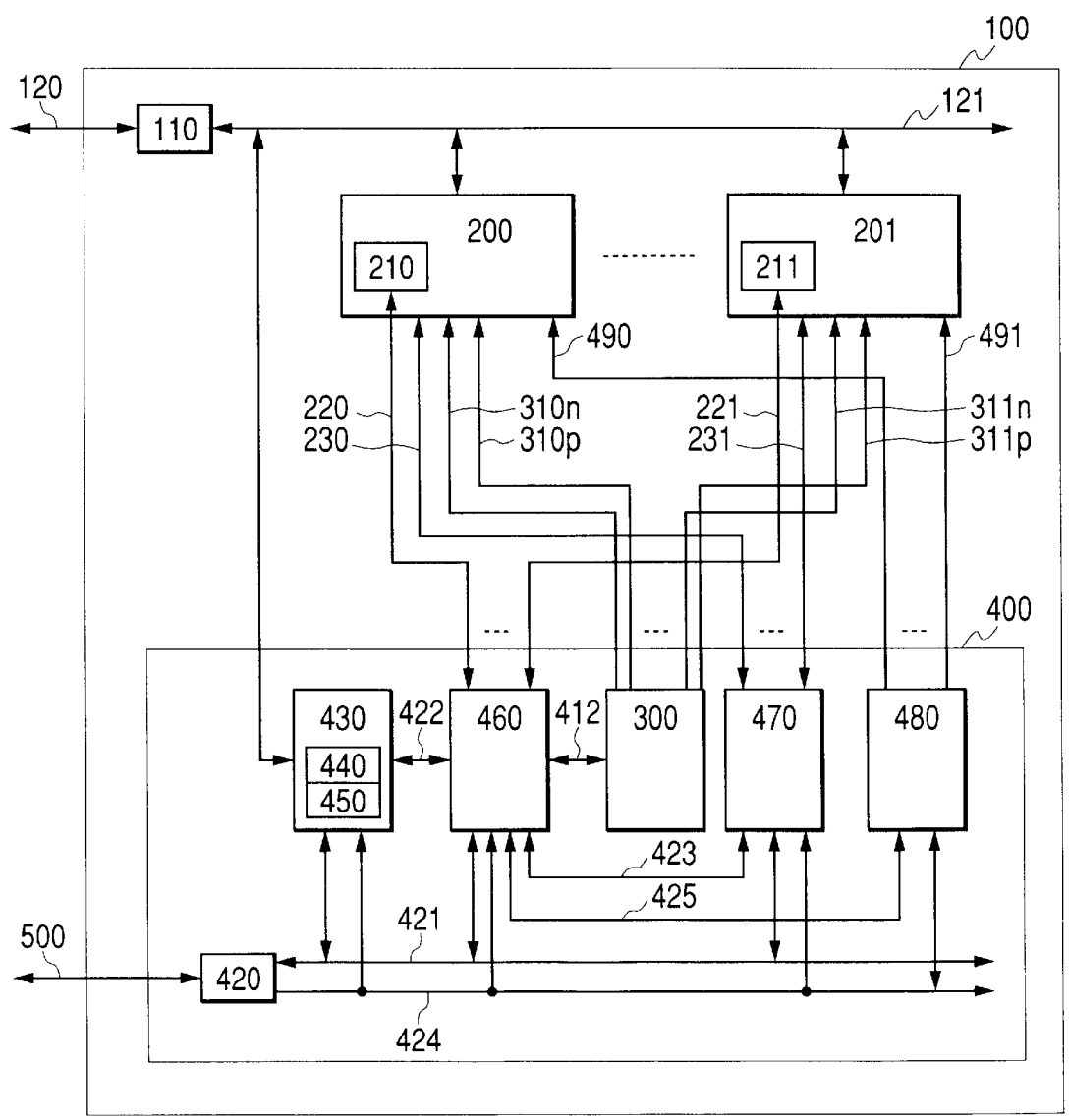
FIG. 10 is a diagram showing the configuration of a system LSI implemented by a fifth embodiment of the present invention.

FIG. 10 is a block diagram showing the configuration of a system LSI implemented by a fifth embodiment of the present invention. The configurations of the register 440 and the non-volatile memory 450 are identical with the first embodiments counterparts shown in FIG. 1 or the second embodiment's counterparts shown in FIG. 7.

The fifth embodiment is different from the fourth embodiment in that, in the case of the fifth embodiment, the substrate-bias generation circuits 300 and 301 are implemented as a single circuit in the functional-module control circuit 400.

Sixth Embodiment

Figure 11:
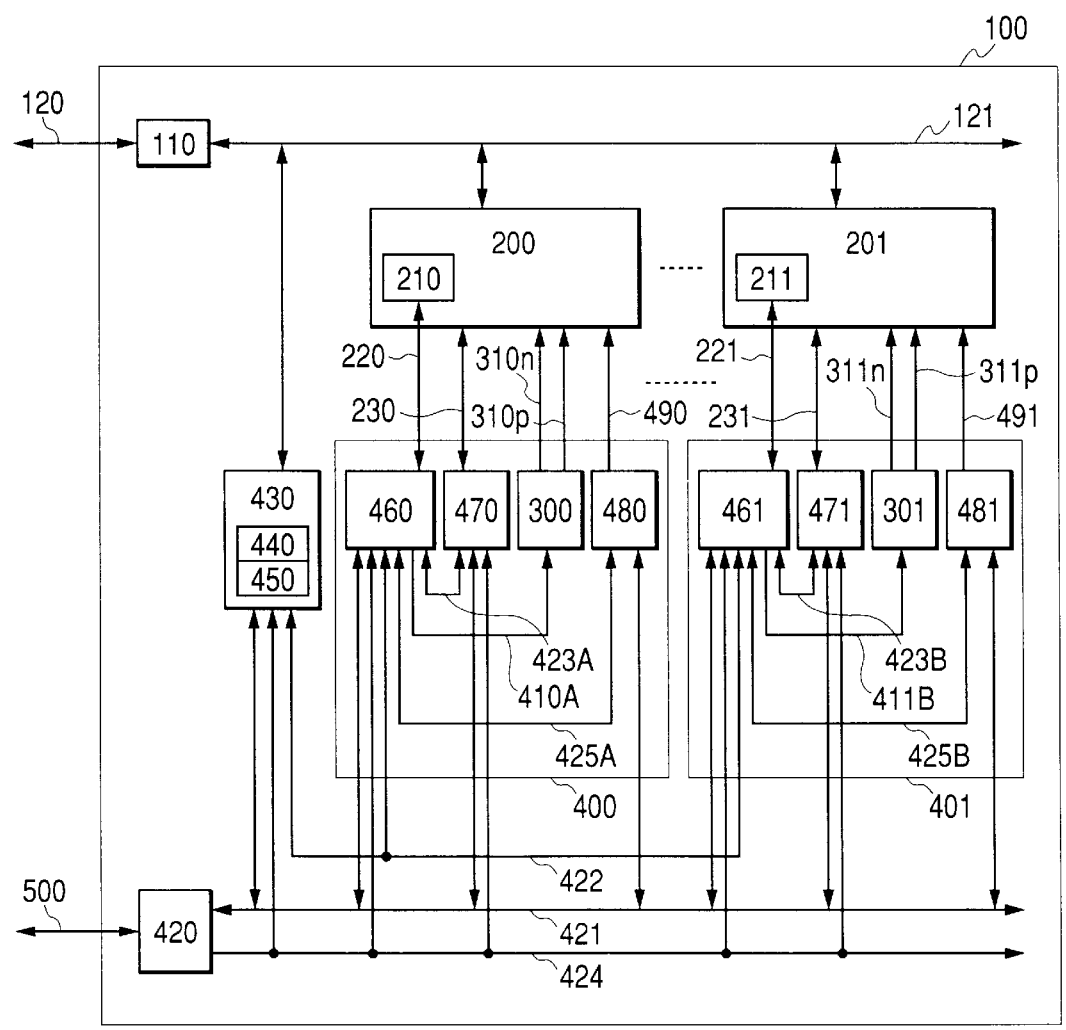
FIG. 11 is a diagram showing the configuration of a system LSI implemented by a sixth embodiment of the present invention.

FIG. 11 is a block diagram showing the configuration of a system LSI implemented by a sixth embodiment of the present invention. The configurations of the register 440 and the non-volatile memory 450 are identical with the first embodiment's counterparts shown in FIG. 1 or the second embodiment's counterparts shown in FIG. 7.

The sixth embodiment is different from the fourth and fifth embodiments in that, in the case of the sixth embodiment, functional-module control circuits 400 and 401 are provided for the functional modules 200 and 201 respectively.

As described above, in accordance with the present invention, by providing a substrate-bias generation circuit capable of controlling substrate biases of functional modules in a system LSI independently of each other and by providing a means for programming the substrate biases, a high-speed operation and low power consumption can both be implemented without lowering the yield and the power consumption can be finely controlled during the operation.

In addition, in accordance with the present invention, even though variations from process to process cause variations in operating frequency among system LSI chips, it is possible to compensate for the variations in operating frequency, increase the yield and, hence, provide a system LSI having any operating frequency margin.

What is claimed is:

1. A semiconductor data processor comprising:
    a plurality of functional modules each used for carrying out predetermined processing;
    substrate-bias generation circuits for supplying substrate biases independent of each other to said functional modules;
    a substrate-bias control circuit for controlling said substrate-bias generation circuits; and a substrate-bias control-value storage unit for storing control values required for controlling said substrate biases to be supplied to said functional modules independently of each other, wherein said substrate biases supplied to said functional modules are controlled by controlling said control values stored in said substrate-bias control-value storage unit and each associated with one of said functional modules.

2. A semiconductor data processor according to claim 1 wherein:

each of said functional modules has at least 2 modes of operation, namely, a mode of an operating state and a mode of a standby state;

said substrate bias supplied to any specific one of said functional modules in said operating state is controlled to a value corresponding to said control value stored for said specific functional module in said substrate-bias control-value storage unit; and said substrate bias supplied to said specific functional module in said standby state is controlled to a predetermined value not corresponding to said control value stored for said specific functional module in said substrate-bias control-value storage unit so that power consumption of said specific functional module in said standby state is smaller than power consumption of said specific functional module in said operating state.

3. A semiconductor data processor according to claim 1 wherein:

said semiconductor data-processing device further has delay measurement circuits each used for measuring a delay of one of said functional modules; and processing carried out by said semiconductor data-processing device includes a process to determine said control values stored in said substrate-bias control-value storage unit by using results of delay measurement, which are produced by said delay measurement circuits for said functional modules.

4. A semiconductor data processor according to claim 1, said semiconductor data-processing device further having a communication interface for executing predetermined processing including operations to read out said control values stored in said substrate-bias control-value storage unit and write said control values into said substrate-bias control-value storage unit in accordance with commands received from a source external to said semiconductor data-processing device.

5. A semiconductor data processor according to claim 1, said semiconductor data-processing device further having at least a non-volatile memory or a register to serve as said substrate-bias control-value storage unit for storing control values required for controlling said substrate biases to be supplied to said functional modules independently of each other, said substrate biases for said functional modules are generated by said substrate-bias generation circuits controlled by said substrate-bias control circuit in accordance with said control values stored for said functional modules in either said non-volatile memory or said register and supplied to said respective functional modules.

6. A semiconductor data processor according to claim 5 wherein said control values stored in said register are transferred to said non-volatile memory by execution of a predetermined procedure or said control values stored in said non-volatile memory are transferred to said register by execution of a predetermined procedure.

7. A semiconductor data processor according to claim 1, wherein said semiconductor data-processing device further have a clock oscillation circuit for outputting clock signals independent of each other to said functional modules, wherein the frequencies of said clock signals output to said functional modules are controlled to values corresponding to said substrate biases supplied to said functional modules.

* * * * *